United States Patent [19]

Cohlman et al.

[11] 4,301,378
[45] Nov. 17, 1981

[54] DUAL RATE BI-DIRECTIONAL SWITCH

[75] Inventors: Donald C. Cohlman, Hanover Park; Daniel R. Schroeder, Glen Ellyn, both of Ill.

[73] Assignee: Motorola, Inc., Schaumburg, Ill.

[21] Appl. No.: 98,424

[22] Filed: Nov. 29, 1979

[51] Int. Cl.³ .............................................. H01H 23/30
[52] U.S. Cl. ..................................... 307/115; 200/1 V
[58] Field of Search ................ 307/115; 200/1 V, 5 R, 200/5 D, 339

[56] References Cited

U.S. PATENT DOCUMENTS

| | | | |
|---|---|---|---|
| 806,735 | 12/1905 | Carpenter | 200/1 V X |
| 2,769,043 | 10/1956 | Ulinski | |
| 3,399,287 | 8/1968 | Euler | 200/339 X |
| 3,564,172 | 2/1971 | Laakso | 200/67 |
| 3,860,771 | 1/1975 | Lynn et al. | 200/5 A |
| 3,931,483 | 1/1976 | Thompson | 200/1 R |
| 3,986,154 | 10/1976 | Yamada et al. | 334/15 |

FOREIGN PATENT DOCUMENTS 956070 12/1956 Fed. Rep. of Germany.

Primary Examiner—L. T. Hix
Assistant Examiner—James L. Dwyer
Attorney, Agent, or Firm—James W. Gillman; Joseph T. Downey

[57] ABSTRACT

A dual rate bi-directional switching system is utilized to control a radio receiver function. An actuator rotates and translates in order to sequentially actuate selected electrical switches which are coupled to a logic circuit by means of two conductors. The logic circuit establishes logic signals to control both the direction and rate of change of the function in response to the position of the actuator.

11 Claims, 4 Drawing Figures

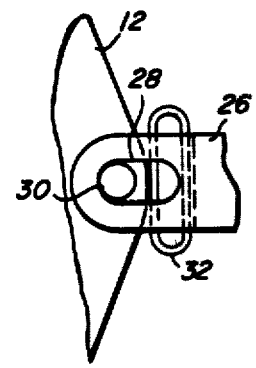
Fig. 1
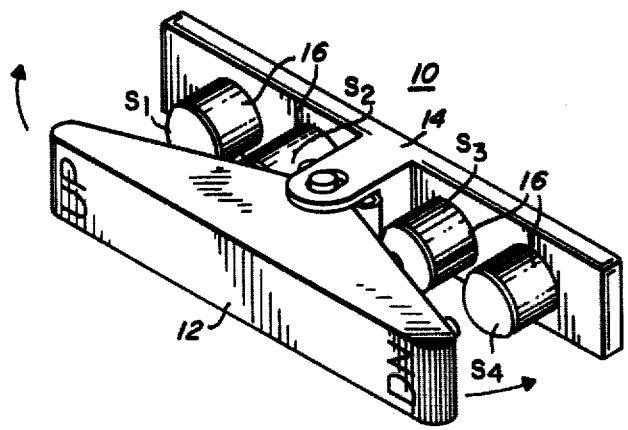
Fig. 3
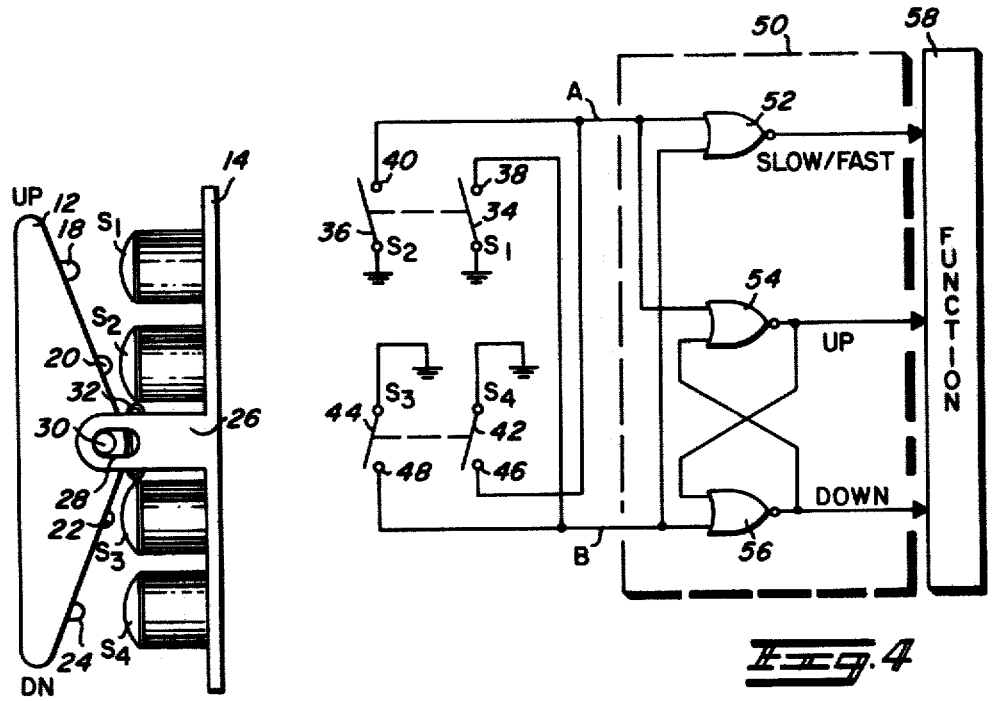
Fig. 2
Fig. 4

4,301,378

DUAL RATE BI-DIRECTIONAL SWITCH

BACKGROUND OF THE INVENTION

1. Field of the Invention

This invention relates to electrical switches for controlling several electronic functions, especially functions of radio transceivers and, more directly, to an improvement in such switches to achieve both dual rate and bi-directional control of such a function over two conductors.

2. Prior Art

There are many prior art electrical switches for controlling multiple functions. A well known example is combination rotational off/on switch and volume control for a radio receiver. The demand for more complex electronic control functions in radio equipment requires more sophisticated switch control. Some known switches in related arts have cam surface actuators which interact with a plurality of individual electrical switches such that when the cam surfaces are repositioned in some manner, the individual switches are sequentially actuated. One principle difficulty with this arrangement is the size of the cam and switch combination and the number of interconnecting conductors which must be used between the location of the individual switches and the device which actually controls the function. The modern, very compact electronic radio transceivers, such as those for installation in automobiles, severly restrict the available for operator assessible switches. The front panels for this type of equipment tend to be very limited in size and the overall compactness of these designs frequently necessitates relocation of the devices for controlling functions to positions remote from the front panel. The compact space allocations do not always provide space for the inclusion of multiple conductor cables running between a power source, a front panel switch location and the device controlling the function. Thus it is advantageous to have both small actuator size and a minimum number of conductors running between the switch actuator location and the location of the controlling device.

Another type of known bi-directional switch, a quadrature switch, has been used in prior art radios which have frequency synthesized tuning systems. The quadrature switch is designed to simulate, by digital encoding, the operation of a standard rotating mechanical tuning knob. A shaft actuates a pair of followers which are connected to two separate series of detent positions arranged to be slightly out of phase. This combination produces high and low signal pulses corresponding to the separate followers contacting each level of the detents when the shaft is rotated. For rotation in either direction, signals will be recieved from one of the followers before signals are received from the other. It is this initial sequencing which determines the direction of rotation and, correspondingly,the direction of tuning change. The speed of tuning is determined by the rate at which the regularly spaced detent positions are contacted by the followers. This rate is digitally decoded and supplied to a control device to determine the speed of tuning adjustment. While the quadrature switch most closely simulates the operation of the well known mechanically actuated dial tuning device, it, too requires considerable space on or very near the front panel of the radio and a plurality of electrical interconnections to a frequency control device.

SUMMARY OF THE INVENTION

Therefore it is a general object of the invention to provide an improved dual rate bi-directional switch.

It is a more specific object to provide a dual rate bi-directional switch having a minimum number of electrical interconnections between the switch and a device controlling a function.

It is another more specific object of the invention to have a dual rate bi-directional switch which requires as little physical space as possible on the control panel of the transceiver and utilizes a logic circuit in conjunction with the switching device to control a predetermined transceiver function.

A dual rate bi-directional electrical switching system is especially adapted to control a radio transceiver function. The system comprises actuator means which can rotate and translate; a plurality of electrical switches positioned near the actuator means and capable of being selectively actuated by it; conductor means comprising two conductors connected to the plurality of switches; and logic means, connected to the conductor means, establishes logic signals in response to selective actuation of said plurality electrical switches, whereby direction and rate of change of the radio transceiver function are controlled in response to the position of the actuator means.

BRIEF DESCRIPTION OF THE DRAWINGS

FIG. 1 is a perspective view of a bi-directional dual rate switch.

FIG. 2 is a side view of the switch shown in FIG. 1.

FIG. 3 is an enlarged side view of a portion of FIG. 2 showing details of the pivotal action of the dual speed switch arrangement.

FIG. 4 is an electrical schematic for the switch in conjunction with logic elements.

DESCRIPTION OF THE PREFERRED EMBODIMENT

FIG. 1 shows a perspective view of a bi-directional dual-speed switch arrangement 10. An actuator 12 is pivotally attached to a base 14 upon which are mounted switches S-1, S-2, S-3, and S-4. The switches S-1 through S-4 are shown as generally dome shaped and each is attached to and positioned above base 14 by an identical spacer 16. Switchs S-1 through S-4 are preferably plastic encased dome switches, a type which is well known to those skilled in the art, and preferred because of low cost and a low actuation force requirement. As will be described in more detail later, switches S-1 to S-4 are preferably of the normally open type, however, any type of switch may be used. The same designation will be used to identify these switches when referring either to their physical configuration or to the equivalent electrical representation in subsequent figures.

FIG. 2 is a side view of switch arrangement 10 of FIG. 1 is which actuator 12 is shown as being substantially triangular in shape. Actuator 12 includes protuberances 18, 20, 22 and 24 which are in alignment with switches S-1 through S-4, respectively. Base 14 includes a flange 26 having an elongated slot 28 in which a rotational axis 30 of actuator 12 may freely move. Rotational axis 30 operates as a pivot and is located at one vertex of the triangular shape of actuator 12. A resilient member 32 is shown mechanically biasing the axis of actuator 12 within slot 28.

In operation, when an operator presses actuator 12 on either side of axis 30 it rotates to bring the corresponding protuberance in contact with one of the dome switches. As shown in FIGS. 2 for example, if the upper portion of actuator 12 is pressed, protuberance 20 will initially contact switch S-2 and, as pressure continues to be exerted, switch S-2 will be actuated. Similarly if the lower portion of actuator 12 were pressed, protuberance 22 would contact and actuate switch S-3. Upon release of the pressure on the actuator 12, resilient member 32 will restore the actuator to its original position, thereby releasing pressure on the actuated dome switch and allowing it to return to its normal electrical state.

As may be seen if FIG. 3, slot 28 in flange 26 allows axis 30 of actuator 12 to rotate, translate or move with a combination of the two motions. Resilient member 32 is shown in the form of a flattened loop of elastomeric material and is positioned adjacent axis 30 to enable it to compress during either a rotation or translation of actuator 12. When actuator 12 is merely rotated about axis 30 only those switches closest to the axis (S-2 and S-3) can be contacted and actuated. As rotation occurs and the protuberance on actuator 12 contacts the corresponding switch, resilient material 30 will be compressed to offer resistance to the operator and to insure a more uniform contact between a protuberance and the corresponding switch. To insure that the operator is demanding a higher speed modification of the controlled function, the entire actuator 12 must be translated with additional operator pressure to actuate either of the switches located further from axis 30. This additional pressure to translate actuator 12 and demand fast actuation will further compress resilient member 30. Thus, as additional pressure is exerted on the upper portion of the actuator 12 as shown in FIG. 2, after rotation has occurred actuator 12 will translate along a path determined by the movement of axis 30 in extended slot 28. Protuberance 18 will then come into contact to actuate switch S-1. Similarly additional operator pressure on the lower portion of actuator 12 will cause protuberance 24 to contact and actuate switch S-4. This feature of requiring translation in addition to rotation insures against an inadvertent actuation of a high speed modification of the function. When the pressure on actuator 12 is released, resilient member 30 returns actuator 12 to its original position thus releasing all pressure from the corresponding actuated switches. Resilient member 32 operates in the same manner regardless of which direction actuator 12 is initially rotated.

Resilient member 32 permits the use of electrical switches having diminished capablity for providing return force. They may be made of light weight material, and supply very little force for returning actuator 12 to its normal position. Thus plastic encased dome switches are utilized in the preferred embodiment. Slot 28 also serves to reduce the dimensional tolerances required for the length of the protuberances on actuator 12, the spacers 16 and the locations for the switches.

FIG. 4 shows the electronic circuit schematic for control of a predetermined transceiver function. Switch S-1 is shown as a normally open switch having a contact arm 34 connected to ground. This contact arm is mechanically connected to contact arm 36 of switch S-2 which is also electrically grounded. The mechanical connection, shown by a broken line connecting the contact arms, represents the coupling by means of actuator 12. Switches S-1 and S-2 have contact terminals 38 and 40 respectively. The relative positions of the contact arms for switches S-1 and S-2 are shown to be at different distances from their respective contact terminals to correspond to the actual physical arrangement of actuator 12 as is shown in FIG. 2. Similarly switch S-4 has a contact arm 42 coupled to ground and switch S-3 had a contact arm 44 also coupled to ground. Switches S-3 and S-4 have contact terminals 48 and 46, respectively. Switches S-3 and S-4 are also shown by a broken line to be mechanically interconnected.

As may be more clearly seen in FIG. 4, terminal 38 is interconnected with terminal 48 to form a conductor designated "B". Terminal 40 is interconnected with terminal 46 to form a conductor designated "A". Conductors A and B are the electrical connections for sending operator selection information to a control device for the controlling function which may be located at some distance from switches S-1 through S-4. Conductors A and B are coupled to logic circuit 50, shown enclosed by a broken line. Logic circuit 50 decodes the operator selection determined by the actuated switches and supplies information to the control device to specify the direction and rate of change of the function. It should be observed that all of the information for a selected change for the predetermined function is transmitted along only two conductors, thus eliminating a large number of interconnecting lines to the front panel of the transceiver.

The preferred embodiment for the invention is an all electronically controlled radio. One such system is described in U.S. Pat. No. 4,135,158 issued to Parmet and assigned to the common assignee of the present application. Logic circuit 50 may comprise a portion of a microprocessor, programmed to operate as a complete electronic control system, which establishes the various logic levels to change the predetermined function in response to an operator selected modification as indicated by the position of actuator 12. Such a microprocessor environment is sophisticated and complex. However, the invention may be more clearly understood in a less complex environment where it may be employed utilizing only a small number of logic gates. While the subsequent description refers to various discrete logic gates it should be understood that the preferred embodiment is a more complex microprocessor controlled radio system.

Conductor A is connected to a first input of a NOR 52 and to a first input of a NOR 54. Conductor B is connected to a second input of NOR 52 and to a first input of a NOR 56. The input of NOR 54 is connected to a second input of NOR 56 and the output of NOR 56 is connected to a second input of NOR 54. This interconnection of NOR's 54 and 56 will be recognized as the logic circuit equivalent of an R-S flip-flop.

The output of NOR 52 is a signal labeled "SLOW/FAST" and is connected to a block 58 labeled "FUNCTION". The output of NOR 54 is labeled "UP" and the output of NOR 56 is labeled "DOWN" and both outputs are connected to block 58.

The operational description of logic circuit 50 employs the nomenclature for standard logic gates and describes only the logic interconnections necessary to achieve control of the designated function. A positive logic system is used throughout the circuit. A voltage source (not shown) provides the logic signal level and only those grounds necessary to establish control are shown. For this circuit, a low logic level at NOR 52 indicates SLOW, and a high level at NOR 52 indicates FAST. A high logic level at either NOR 54 or NOR 56 will indicate the operator selection of either UP or DOWN respectively. The normal or inactive state of logic circuit 50 is characterized by low logic levels at the outputs of all NOR's. Thus, while logically a SLOW modification is commanded by this normal state no direction has been specified so that no modification can occur.

In operation, assuming that a change at SLOW speed UP is desired, actuator 12 is rotated to actuate switch S-2 to close causing conductor A to assume a low level and thus establishing low levels at one input of NOR 52 and at one input of NOR 54. Conductor B remains at a high level. The output of NOR 52 remains low indicating SLOW operation. The high level at one input of NOR 56 due to conductor B insures that the output of NOR 56 is at a low level thus inhibiting a DOWN command. Conductor A at a low level in combination with the low level output of NOR 56 extablishes low levels at both inputs of NOR 54 which produces a high level at its output thus designating an UP command.

Additional pressure on actuator 12 will cause it to translate and bring protuberance 18 in contact to actuate switch S-1 to close. The actuation of S-1 establishes a low level on conductor B. Now both inputs to NOR 52 are low and its output is therefor at high level designating FAST. Conductor B now at a low level does not change the low level output at NOR 56 which continues to inhibit a DOWN command. Conductor A continues at a low level which in conbination with the low level at the output of NOR 56 maintains the high level at the output or NOR 54 to continue to designate UP.

The operation for DOWN command at SLOW speed is very similar. Rotation of the lower portion of actuator 12 closes switch S-3 and establishes conductors A and B at high and low levels respectively. The output of NOR 52 will again be at a low level indicating a SLOW operation. The high level of conductor A insures that the output of NOR 54 is at a low level thus inhibiting and UP command. Since conductor B and the output of NOR 54 are at a low level the inputs to NOR 56 are both at a low level. The output of NOR 56 is therefore at a high level indicating a DOWN command. Additional operator pressure on actuator 12 will cause switch S-4 to close thus establishing conductor A at a low level. This will not affect the outputs of NOR 54 or NOR 56 which inhibit an UP command and designate a DOWN command respectively but it will establish both inputs of NOR 52 at a low level. The output of NOR 52 will now be at a high level thus designating FAST.

In all cases the outputs from NOR's 52, 54 and 56 are coupled to block 58 labeled "FUNCTION". This merely is used to represent the predetermined transceiver function which the bi-directional dual speed switch is to control. Many such functions can be controlled including volume, tuning, channel sequencing, memory addressing and the like and each one will be controlled by an appropriate control device. Such devices are well known in the art and can very simply be adapted to accept the logic command levels coming from logic circuit 50 or its equivalent to cause proper operation. In a very simple example, a reversible DC motor could be driven with a suitable interface circuit by such logic control signals to designate both the direction and speed of rotation. This motor would be coupled to a rotational potentiometer to control a function, such as volume. In the more sophisticated microprocessor of the preferred embodiment, digital clock type pulses would be employed to increment or decrement a reversible binary counter coupled to a voltage dependent resistor (external to the microprocessor) to control the predetermined function. Logic signals would control the direction of counting and the rate of production of the pulses would control the rate of change of the function. The feedback for the continued actuation of the switch in all cases is through the audio or visual perception of the operator.

While a specific embodiment of this invention has been shown and described, further modifications and improvements will occur to those skilled in the art. All modifications which retain the basic underlying principles disclosed and claimed herein are within the scope of this invention.

We claim:

1. A dual rate bi-directional electrical switching system especially adapted to control a radio receiver function, comprising:
    actuator means adapted for both rotation and translation in the same plane;
    a plurality of electrical switches positioned adjacent to and capable of being selectively sequentially actuated by said actuator means, said plurality being separated into two groups of switches, at least one member of each group being actuatable by a corresponding rotation of said actuator;
    conductor means comprising two conductors connected to said plurality of electrical switches; and
    logic means connected to said conductor means, establishing logic control signals in response to selective sequential actuation of said plurality of electrical switches, whereby both the direction and rate of change of the function are controlled in response to the position of said actuator means.

2. The switching system of claim 1 wherein said plurality of switches comprises four switches.

3. The switching system of claim 2 wherein said actuator means is located on the front panel of a radio transceiver and wherein the plane in which rotation and translation of said actuator occur is substantially perpendicular to the plane of said front panel.

4. The switching system of claim 3 wherein said actuator has an axis of rotation located in a plane substantially parallel with the plane of said front panel and wherein said four switches are positioned such that said separated groups each comprise one pair of switches and said groups are located on opposite sides of said axis of rotation.

5. The switching system of claim 4 wherein said logic means includes flip-flop means and a logic gate and wherein the logic levels of said flip-flop circuit determine direction of change for said predetermined function and said logic levels of said logic gate means designate which of two rates of change of said function are activated.

6. The switching system of claim 5 wherein said actuator includes protuberances aligned with said electrical switches and wherein said electrical switches further comprise four plastic encased dome switches.

7. The switching system of claim 6 wherein said actuator means further includes resilient means coupled to said actuator means and responsive to a rotation and translation of said actuator establishing said rotation and translation, to return said actuator to an initial position after release of operator pressure.

8. A dual rate bi-directional electrical switching system for adjusting a predetermined function of a radio receiver having an operator accessible actuator mounted on the front panel thereof, comprising:

actuator means, adapted for both rotation and translation in a plane substantially perpendicular to said front panel, said actuator means being generally triangular in shape when viewed from a side and having a rotational axis at one vertex of said triangular shape, said rotational axis laying in a plane substantially parallel with the plane of said front panel, said actuator means further including pairs of projections extending outwardly from each triangular line segment adjacent said vertex;

two pairs of electrical switches, one of said pairs being located on each side of said rotational axis, said switches in each of said pairs being in alignment with and capable of being actuated by corresponding ones of said actuator projections;

two of conductors, each of said conductors being connected to one switch from each of said pairs of electrical switches; and logic means, coupled to said two conductors, including flip-flop means establishing a logic output designating the selected direction for change of said predetermined function and logic gate means establishing a logic output designating the rate of change of said function as determined by which members of one of said pair of switches have been actuated, whereby the predetermined function is adjusted in accordance with a rotation and translation of said actuator.

9. The switching system of claim 8 wherein said actuator comprises an elongated rectangular shape when viewed in a direction substantially normal to said front panel.

10. The switching system of claim 9 wherein said two pairs of electrical switches comprise plastic encased dome switches.

11. The switching system of claim 10 wherein said actuator means further includes resilient means coupled to said actuator means and responsive to a rotation and translation of said actuator establishing said rotation and translation, to return said actuator to an initial position after release of operator pressure.

* * * * *